United States Patent [19]

Tabuchi et al.

[11] Patent Number: 5,202,652
[45] Date of Patent: Apr. 13, 1993

[54] SURFACE ACOUSTIC WAVE FILTER DEVICE FORMED ON A PLURALITY OF PIEZOELECTRIC SUBSTRATES

[75] Inventors: Toyoji Tabuchi, Kanagawa; Mitsutaka Hikita, Hachioji; Nobuhiko Shibagaki, Kokubunji; Tetsuya Hirashima, Katsuta, all of Japan

[73] Assignee: Hitachi, Ltd., Tokyo, Japan

[21] Appl. No.: 595,178

[22] Filed: Oct. 10, 1990

[30] Foreign Application Priority Data

Oct. 13, 1989 [JP] Japan .................. 1-264920

[51] Int. Cl.$^5$ ............................................. H03H 9/64
[52] U.S. Cl. ................................... 333/193; 333/133; 310/313 R
[58] Field of Search ................... 333/193–196, 333/133; 310/313 R, 313 B, 313 C, 313 D; 455/83; 370/24

[56] References Cited

U.S. PATENT DOCUMENTS

| 4,468,642 | 8/1984 | Hikita ................................. 333/193 |
| 4,733,122 | 3/1988 | Shinonaga et al. ............. 333/194 X |
| 4,803,449 | 2/1989 | Hikita et al. .................... 333/193 |

FOREIGN PATENT DOCUMENTS

| 0269064 | 6/1988 | European Pat. Off. |
| 0367181 | 5/1990 | European Pat. Off. ............ 333/193 |
| 60-208110 | 10/1985 | Japan . |
| 0070813 | 4/1986 | Japan ................................ 333/133 |
| 0261211 | 11/1987 | Japan ................................ 333/193 |
| 0054009 | 3/1988 | Japan ................................ 333/193 |

OTHER PUBLICATIONS

Horine, B. H., "Saw Resonator Filters: Applications and Capabilities," 1985 *IEEE-MTT-S International Microwave Symposium Digest*, pp. 247–250, Jun. 1985.

*Primary Examiner*—Paul M. Dzierzynski
*Assistant Examiner*—Seung Ham
*Attorney, Agent, or Firm*—Fay, Sharpe, Beall, Fagan, Minnich & McKee

[57] ABSTRACT

A surface acoustic wave device is disclosed for use in a communication apparatus where the surface acoustic wave device has a multiple of surface acoustic wave elements with different filter characteristics formed on mutually distinct piezoelectric substrates. The different filter characteristics combine to form filters having desired filter characteristics.

12 Claims, 9 Drawing Sheets

FIG. 6
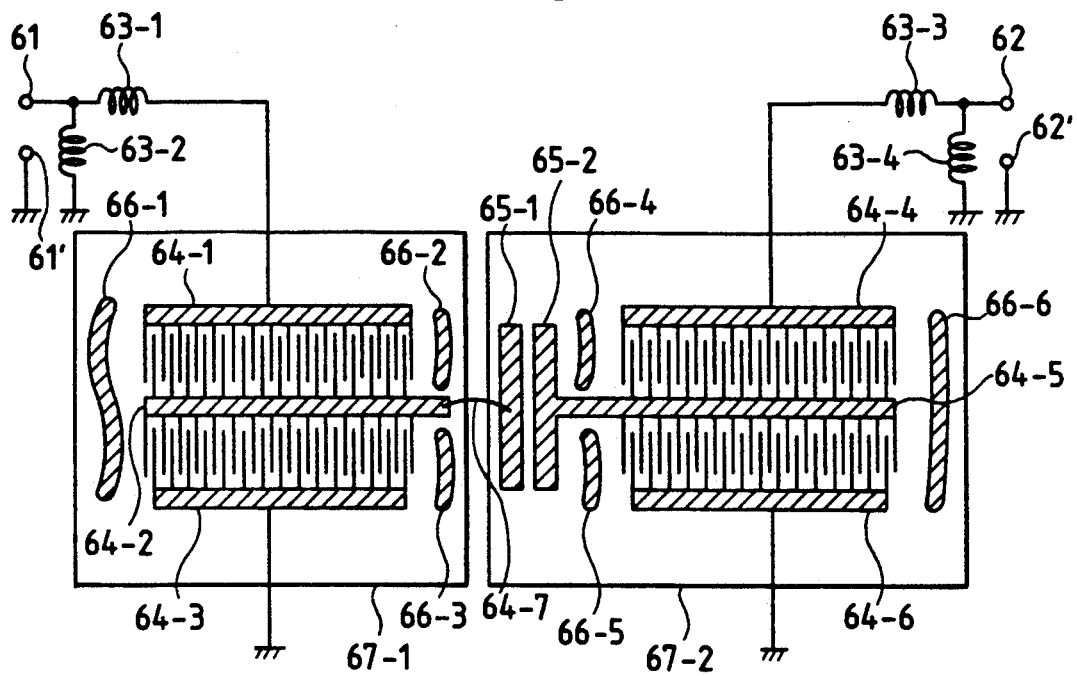
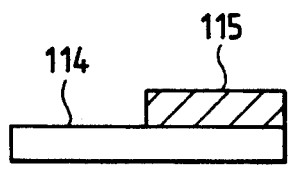
FIG. 11A
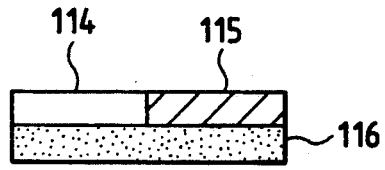
FIG. 11B
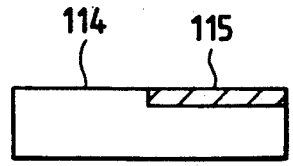
FIG. 11C

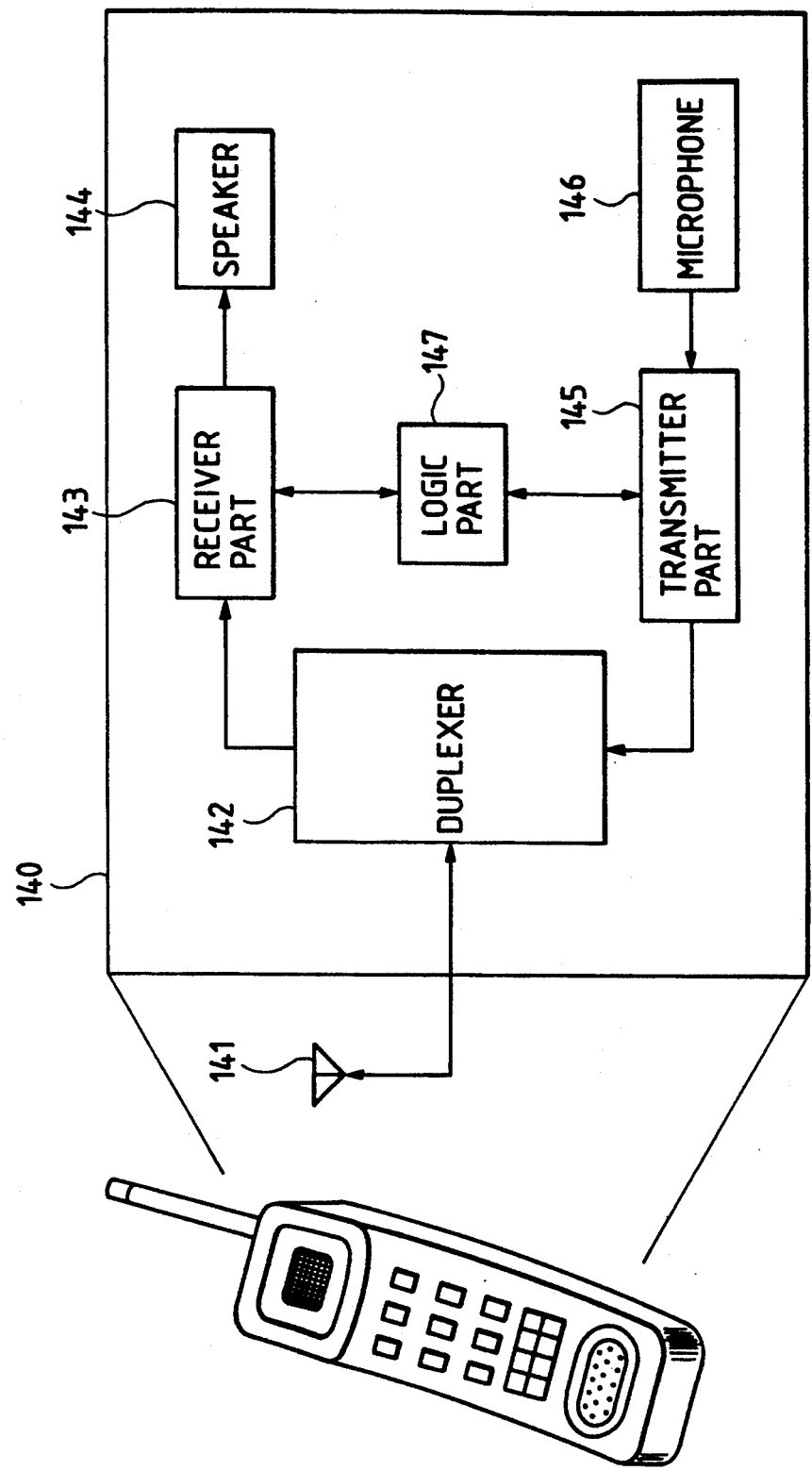

SURFACE ACOUSTIC WAVE FILTER DEVICE FORMED ON A PLURALITY OF PIEZOELECTRIC SUBSTRATES

BACKGROUND OF THE INVENTION

1. Field of the Invention

The present invention relates to a surface acoustic wave device and a communication apparatus, and more particularly concerns a surface acoustic wave device and communication apparatus especially preferable for use in mobile radio communication and cellular radio communication, such as mobile telephones and pagers 2. Description of the Related Art A conventional surface acoustic wave filter is formed on a piezoelectric substrate by combining a transducer for converting an electrical signal to surface acoustic wave and a transducer for converting the surface acoustic wave to electric signal. Surface acoustic wave filter of this type is described, for example, in an article in the *IEE Trans.*, "Microwave Theory and Techniques", MTT-22, (1985) pp. 510–518. In a prior mobile telephone system for simultaneous transmission and reception with use of a single antenna, the antenna is connected to the input or output of a transmitter surface acoustic wave filter and receiver surface acoustic wave filter through an appropriate feeder line. It is described, for example, in an article in the *IEEE Trans.*, "Microwave Theory and Techniques", MTT-36, (1988) pp. 1047–1056. The transmitter surface acoustic filter and receiver surface wave filter are implemented in a single module, and an antenna duplexer is connected to an antenna terminal of a two-way receiver of the mobile telephone system.

A prior filter is constructed with coupled SAW resonators is described, for example, in the Japanese Patent Laid-Open 63132515 and consists of a combination of one-port surface acoustic wave resonators formed on a single piezoelectric substrate. The filter characteristic synthesis or cutoff frequency response is determined by electrode structure of the resonator.

SUMMARY OF THE INVENTION

However, the prior surface acoustic wave filter or duplexer of combined surface acoustic wave filters has the disadvantage that it is not available in suitable components for the European mobile telephone system because the transmitter and receiver frequency bands there are very wide and the transmitter and receiver band intervals are very narrow.

Also, the prior art has the disadvantage that a low loss in a pass band is inconsistent with a high insertion loss in a stop band. In mobile telephone systems and similar communication systems, the band intervals are made narrow. The filters, therefore, are required to have a sharp cutoff frequency response. In a circuit construction using a multiple of surface acoustic wave resonators, it is required to use a narrow band one-port resonator that particularly affects a rejection characteristic in the vicinity of the pass band. In order to accomplish the narrow band resonant characteristic, it is advantageous to use a substrate having low electro-mechanical coupling coefficient. However, an increased loss occurs due to low conversion efficiency. If the substrate has low electro-mechanical coupling coefficient to achieve the sharp cutoff frequency response, the loss is increased because a resonator for insertion loss synthesis at frequencies away from the pass band is formed on the same substrate.

In order to solve the foregoing problems of the prior art and to achieve other purposes, the present invention has the following features: In accordance with one aspect of the invention, a surface acoustic wave device comprising a first surface acoustic wave element having a first filter characteristic and a second surface acoustic wave element having a second filter characteristic, the first and second surface acoustic wave elements being provided on a first and a second piezoelectric substrate, respectively, and the first and second filter characteristics combine to form a filter having a desired filter characteristic, is provided.

The first and second surface acoustic wave elements may include a device called a transducer comprising at least two electrodes have a multiple of finger electrodes interpolated into each other on the piezoelectric substrate. There may be conductive thin wires, slits, and/or grooves formed on the surface of substrate of piezoelectric material or non-piezoelectric material on which piezoelectric film is coated. An input electric signal is converted to surface acoustic wave which can propagate on the piezoelectric substrate. An excited surface acoustic wave is converted to electric signal. This feature allows the surface acoustic wave device to have a filter characteristic referred to in the present invention. The first and second surface acoustic wave devices referred to in the present invention may be any type of surface acoustic wave device as long as they have the filter characteristic mentioned above even if they are named resonators or "one-port resonators".

In accordance with a limited aspect of the present invention, a first piezoelectric substrate having a first electro-mechanical coupling coefficient, and a second piezoelectric substrate having a second electro-mechanical coupling coefficient is provided. A combined filter is formed from the combination of surface acoustic wave elements of different electro-mechanical coefficients of the piezoelectric substrates. The combined filter can have a sharp cutoff frequency response with low loss. In other words, the synthesized filter formed of a multiple of surface acoustic wave elements can have, for example, a pass band and stop band defined by the resonance characteristics of the elements (resonators). A surface wave element formed on the piezoelectric substrate having small electro-mechanical coefficient has a narrow band. It can be used to reject portions in the vicinity of the pass band to accomplish sharp cutoff response A surface acoustic wave element formed on the piezoelectric substrate having a large electro-mechanical coefficient has resonant characteristics of high exciting efficiency of surface acoustic wave and a wide band. It can be used as a resonator for rejecting portions away from the pass band where sharp frequency responses are not needed. This allows low loss and high rejection characteristics to be accomplished. The combined filter of the surface acoustic wave elements formed on the multiple of piezoelectric substrates having different electro-mechanical coefficients is available as a filter with both sharpe low loss and high rejection. This results is obtained by the combined filter formed from the surface wave elements on the piezoelectric substrates having different electro-mechanical coefficients. This effect can be obtained by combining multiple piezoelectric substrates having different coefficients on a common substrate.

In accordance with still another aspect of the present invention, the surface acoustic wave device also comprises a first package and a second package, the first surface acoustic wave element being provided in the first package, and the second surface acoustic wave element being provided in the second package. The multiple surface wave elements forming the combined filter sealed in the different packages cannot be achieved unless the first and second surface acoustic wave elements mentioned above are provided on the different substrates. This feature of the present invention provides significant benefits in making small and light communication apparatuses, such as mobile telephones and portable telephones.

In accordance with another limited aspect of the present invention, the surface acoustic wave device further comprises a signal filter having a third filter characteristic. With the signal filter formed by a surface acoustic wave element on the same piezoelectric substrate as the first surface acoustic wave element or the second surface acoustic wave element, it can be made smaller and lighter. The surface acoustic wave device used in a communication apparatus such as a portable telephone has a single antenna. According to the present invention, therefore, the surface acoustic wave device can be achieved so that a signal received by the antenna and a signal transmitted by the antenna can be filtered through the combined filter mentioned above and the signal filter mentioned above.

There is provided a duplexer comprising transmitter and receiver filters and a mixer circuit comprising a receiver second filter and local filter. The receiver and receiver second filters are required to have a particularly high performance frequency response. Usual surface acoustic wave filters are not available as having sharp frequency response. In the present invention, the transmitter filter in the duplexer can compensate the defect, and the filter in the mixer formed in the same chip or package as the local filter can compensate the defect. This means that the required frequency responses can be attained from the antenna terminal to the receiver terminal and from the receiver terminal to the mixer.

One advantage of the present invention can provide is a surface acoustic wave device and communication apparatus that provide a sharp filter cutoff frequency response and low loss and high rejection characteristics.

Another advantage of the present invention can provide is a surface acoustic wave device and communication apparatus available for miniaturization and light weight.

Further, another advantage the present invention can provide is a surface acoustic wave device and communication apparatus available for a system having wide transmitter and receiver band widths and a narrow interval between the transmitter and receiver bands.

Still further advantages of the present invention will become apparent to those of ordinary skill in the art upon reading and understanding of the following detailed description of the preferred embodiments.

BRIEF DESCRIPTION OF THE DRAWINGS

The invention may take form in various parts and arrangements of parts. The drawings are only for purposes of illustrating the preferred embodiments and are not to be construed as limiting the invention.

FIG. 6 is a diagram illustrating an embodiment of the surface acoustic wave device according to the present invention;

FIGS. 11A, 11B and 11C are views illustrating fabricating processes of further more another embodiment of a surface acoustic wave device according to the present invention;

DETAILED DESCRIPTION OF THE PREFERRED EMBODIMENTS

Figure 1A:
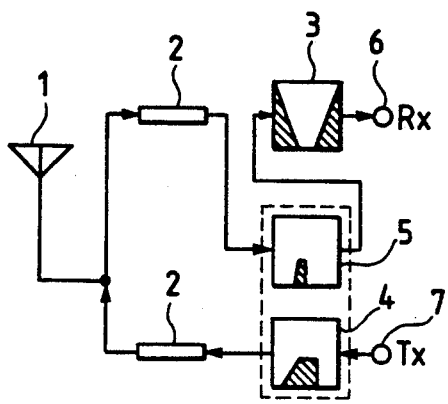
FIG. 1A is a circuit diagram illustrating a communication apparatus of one embodiment according to the present invention.

For the purposes of illustration only, the present invention will now be illustrated by the following embodiments. Of course, the present invention shall not be limited to the following embodiments. The same numbers in the drawings represent the same arrangements.

Figure 1B:
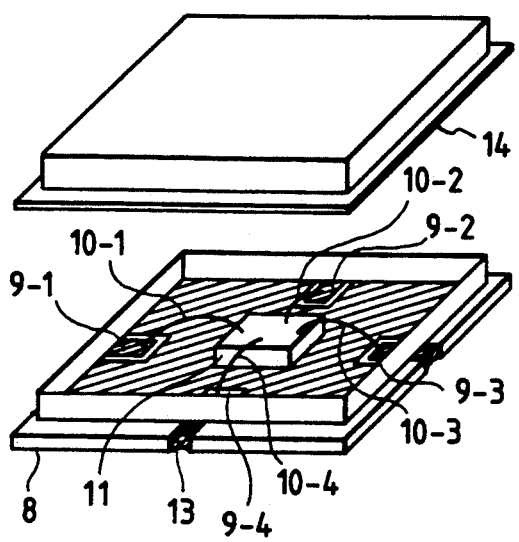
FIG. 1B is a perspective view illustrating a surface acoustic wave device of the embodiment according to the present invention.

FIGS. 1A and 1B are schematic representations of an embodiment of the present invention. In the Figures, the number 1 represents an antenna, 2 is a transmission line, 3 is a receiver first stage filter, 4 is a transmitter filter, 5 is a band rejection filter, 6 is a receiver terminal, 7 is a transmitter terminal, 8 is a package base, 9-1, 9-2, 9-3, and 9-4 are package bonding pads, 10-1, 10-2, 10-3, and 10-4 are lead wires, 11 is a surface acoustic wave (SAW) filter, 13 is a package electric terminal, and 14 is a package cap. FIG. 1A shows a duplexer distributor used in a simultaneous transmission-reception radio apparatus such as found in a mobile telephone.

In general, the duplexer consists of a transmitter filter and a receiver filter. This arrangement allows for transmission and reception with a single antenna. The conventional duplexer, as shown in FIG. 2A, is constructed with the transmitter filter 4 and receiver filter 3 connected in parallel to the antenna terminal through the appropriate transmission lines 2.

Figure 2A:
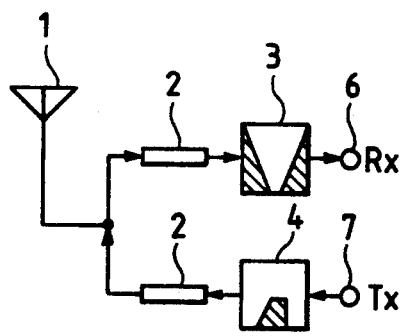
FIG. 2A is a circuit diagram illustrating an embodiment in which the present invention is applied to a duplexer.
Figure 2B:
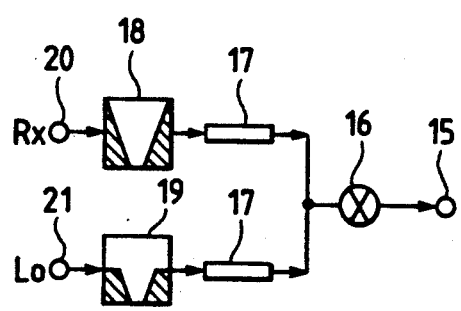
FIG. 2B is a circuit diagram illustrating an embodiment in which the present invention is applied a mixer.

The mixer section shown in FIG. 2B uses a circuit construction similar to the duplexer of FIG. 2A. In the figure, the number 15 represents an intermediate frequency terminal, 16 is a mixer, 17 are transmission lines, 18 is a receiver second stage filter, 19 is a local filter, 20 is a receiver terminal, and 21 is a local filter terminal. In the mixer section, similarly, the receiver second stage filter 18 and the local filter 19 are connected in parallel to the input of the mixer 16 through the appropriate transmission lines 17.

Surface acoustic wave filters can replace dielectric resonator filters 3, 4, 18 and 19 shown in FIGS. 2A and 2B. In fact, mobile telephones in North American countries use the surface acoustic filters. However, mobile telephone systems in European countries, unlike the North American systems, use very wide transmission and reception frequency bands and very narrow transmission and reception band intervals. This means that the filters must have a sharp cutoff frequency response. Such a characteristic cannot be achieved using the usual surface acoustic wave filters.

Figure 3A:
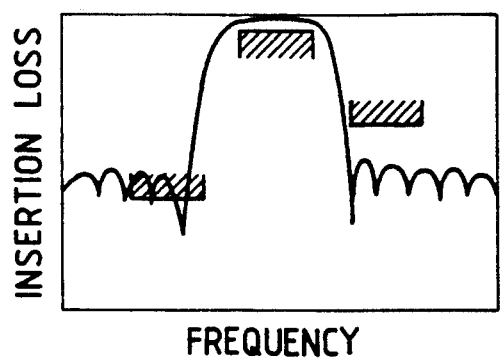
FIG. 3A is a graph illustrating a duplexer reception filter frequency response.

The present invention surface acoustic wave device can be used in this system. This will be described below with reference to FIG. 1A. The frequency response of the receiver filter 3, as shown in FIG. 3A, is not sufficient at all for the wide band requirements of the mobile telephone system in Europe, particularly with respect to insertion loss at low frequencies. In the present invention, the duplexer has the transmitter filter and receiver filter built in so that such a desired frequency as shown in FIG. 3C can be obtained between the antenna terminal and receiver terminal 6.

Figure 3B:
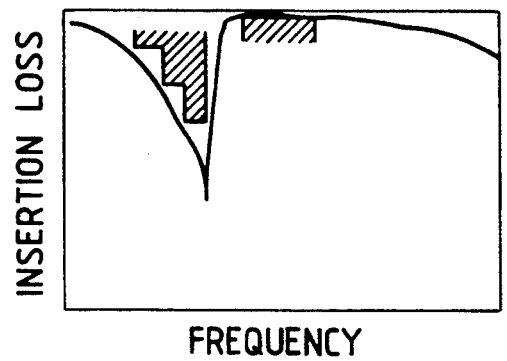
FIG. 3B is a graph illustrating difference between a receiver filter frequency response and a frequency response required for a receiver system.
Figure 3C:
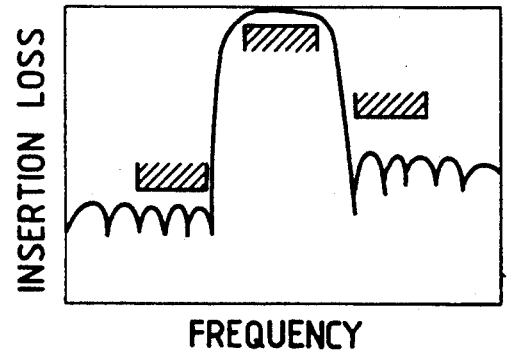
FIG. 3C is a graph illustrating a receiver system frequency response accomplished according to the present invention.
Figure 3D:
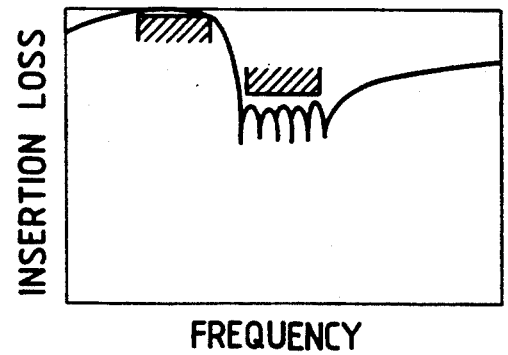
FIG. 3D is a graph illustrating a duplexer transmission filter frequency response.

In general, the transmitter filter 4 has a transmission band which is a pass band and a reception band which is an attenuation band, as shown in FIG. 3D. The receiver filter response shown in FIG. 3A is incompatible in a wedge-like band shown in FIG. 3B as compared with the one required between the antenna terminal and receiver terminal Rx as shown in FIG. 3C. The wedge-like band is similar to the frequency response of the transmitter filter 4 shown in FIG. 3D. The filter pattern for achieving that characteristic is not similar to the receiver filter pattern at all. IT is very like the transmitter filter pattern.

Figure 4A:
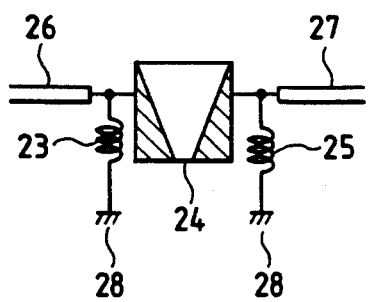
FIG. 4A is a circuit diagram illustrating an embodiment of a surface acoustic wave device according to the present invention.
Figure 4B:
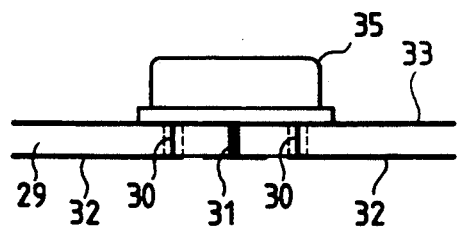
FIGS. 4B and 4C are diagrams illustrating an embodiment of a surface acoustic wave device according to the present invention.
Figure 4C:
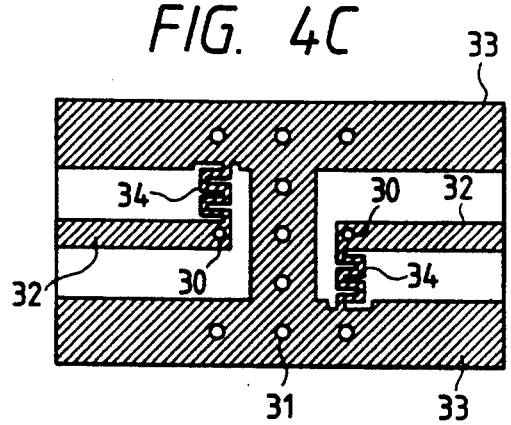

In view of the problems mentioned above, FIG. 1A shows a circuit that is formed in the same chip or package as the transmitter filter 4 to attain the characteristic between the antenna terminal and the receiver terminal Rx shown in FIG. 3B. The surface acoustic wave filter can be formed using the thin film process used for semiconductor IC. It is desirable in view of the yield increase that filters of similar pattern should be formed using the same process. It is necessary to add external inductors to cancel out capacitances between electrodes of a surface acoustic wave exciting transducer as shown in FIG. 4A. (In the actual circuit, micro-strip lines are used to form the external inductors as shown in FIGS. 4B and 4C.) In the figures, number 23 and 25 indicate matching inductors, 24 is the surface acoustic wave filter, 26 and 27 are transmission lines, 28 is a ground, 29 is a circuit substrate, 30 is a through hole, 31 is a ground, 32 and 3 are patterns formed on the circuit substrate, 34 is a matching network, and 35 is a surface acoustic wave filter. The receiver filter 3, for example, has a similar external circuit inserted in its input and output terminals. It is impossible to form the characteristic shown in FIG. 3B in the receiver filter in that view. It has to be formed in another chip in addition to the external circuit. In order to make the whole circuit small, it is preferable that the chip (pattern) should be the same as the transmitter filter 4 or it should be implemented in the same package.

The actual circuit of the present invention is shown in FIG. 1A. The figure is chiefly related to the duplexer that allows the transmitter system Tx and the receiver system Rx to use a single antenna. The transmitter filter 4 and the filter 5 which have the characteristics shown in FIG. 3B are formed in the same chip or package. The signal wave incoming to the antenna terminal passes through the appropriate transmission line 2 and is inputted to the receiver filter 3 through the filter 5. This achieves the frequency response (FIG. 3C) needed between the antenna terminal and the terminal Rx. The size of the whole circuit, as seen from the figure, is the same as the usual surface acoustic wave filter shown in FIG. 2A.

The chip configuration and embodiment are shown in FIG. 1B. In that figure, a four pin flat package has the filters 4 and 5 (FIG. 1A) formed on a single chip 11. Pins 9-1 and 9-2 of the package correspond to the antenna terminal and receiver filter terminal of the filter 5. Pins 9-3 and 9-4 of the package correspond to the input and output terminals of the transmitter filter 4.

As stated in the foregoing description, the present invention allows the surface acoustic wave filter to be available for use in the North American system. The present invention is also available for use in European mobile telephone systems which have wide transmission and reception bands and very narrow intervals between transmission and reception bands. Use of the present invention will not change the volume of the package and the size of the whole circuit at all.

FIG. 1A corresponds to a duplexer in which the transmitter system Tx and the receiver system Rx can use a single antenna in common. Similar construction can be made for a mixer as shown in FIG. 2B. The mixer is to convert, for example, a receiver signal to immediate frequency so that the receiver signal and a local oscillator frequency signal can be applied to a nonlinear device, such as a transistor, FET, or diode to take out differing frequencies of the two signals.

FIG. 2B shows that the receiver second filter 18 and local filter 19 are connected through the appropriate transmission lines 17 to the mixer 16. This allows the signal received at the terminal Rx and the local oscillator frequency at the terminal Lo to be inputted to the mixer 16. The frequency response of the receiver second filter 18, however, is not sufficient for European mobile telephone systems.

Figure 5A:
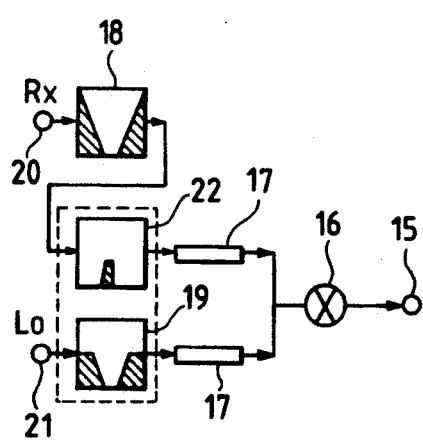
FIG. 5A is a circuit diagram illustrating another embodiment of the surface acoustic device according to the present invention.

The local filter 19 has a band rejection type like the duplexer transmitter filter 4 in FIG. 1A. This filter is used to form the wedge-like band rejection which is not compatible with the receiver second filter. The wedge-like ban rejection characteristic can be formed in the same chip or package as the local filter 19. The actual circuit of the foregoing is shown in FIG. 5A. In the figure, 15 represents an intermediate frequency terminal, 16 is a mixer, 17 are transmission lines, 18 is a receiver second filter, 19 is a local filter, 20 is a receiver terminal, 21 is a local filter terminal, and 22 is a band rejection filter. The signal wave incoming to the antenna terminal Rx passes through the receiver second filter 28. It then is inputted to the filter 22 and is passed through the appropriate transmission line 17 to the mixer 16. This can achieve the necessary frequency response between the terminal Rx and mixer 16.

Figure 5B:
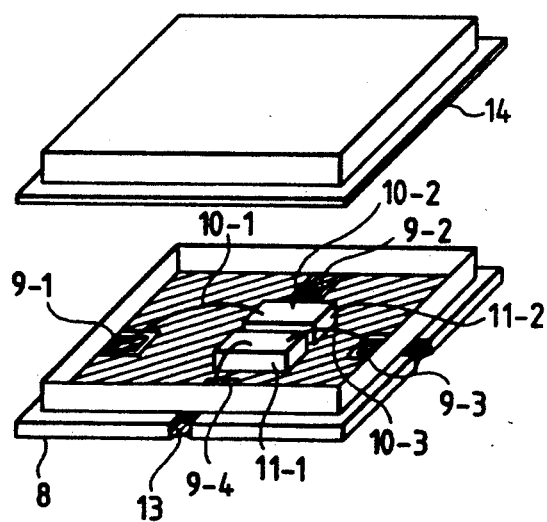
FIG. 5B is a perspective view illustrating further another embodiment of the surface acoustic wave device according to the present invention.

The present invention cannot always have the filters 4 and 5 formed in the same chip as in FIG. 1B. The filters formed in different chips, as shown in FIG. 5B, can be implemented in the same package to provide the equivalent function.

This and following paragraphs describe a few embodiments using different piezoelectric substrates in detail. FIG. 6 shows a structure of an embodiment of the filter construction with coupled SAW resonators according to the present invention. The filter is formed of four one-port resonators made of electrodes 64-1, 64-2, 64-3, 64-4, 64-5, and 64-6 and one gap capacitor made of electrode patterns 65-1 and 65-2 on two piezoelectric substrates that can propagate the surface acoustic wave. The electrodes 64-2 and 65-1 are electrically connected together with a bonding wire 647. In the figure, a number 61 indicates an input terminal, 61' is an input grounding terminal, 62 is an output terminal, 62' is an output grounding terminal, 63-1, 63-2, 63-3, and 63-4 are matching inductors with external circuits, and 66-1, 66-2, 66-3, 66-4, 66-5, and 66j-6 are sound absorption material to absorb the surface acoustic waves leaking out of the resonators. It should be noted that the electro-mechanical coupling coefficient of the piezoelectric substrate 67-1 is lower than that of the piezoelectric substrate 67-2. Each resonator consists of an interdigital transducer made up of multi-pair finger electrodes that are interpolated into each other. The interdigital transducer can be confined with internal reflection by the finger electrodes themselves even without reflectors on both sides.

Figure 7A:
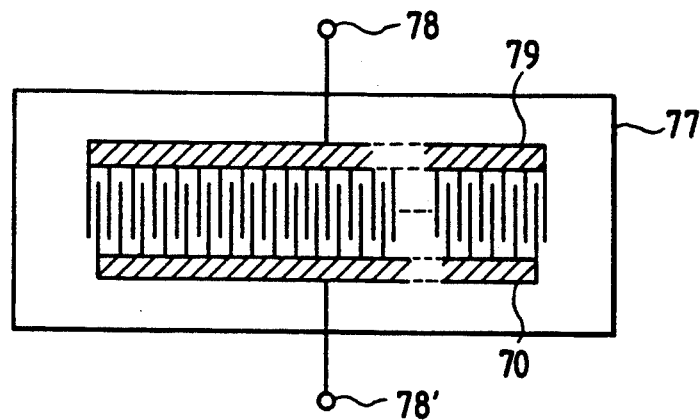
FIGS. 7A, 7B, and 7C are a structure, equivalent circuit and an impedance characteristic illustrating a one-port resonator, respectively.
Figure 7B:
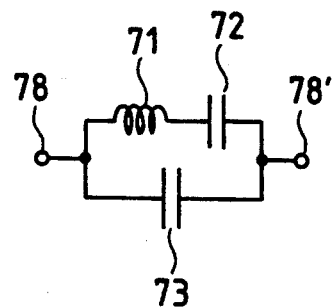
Figure 7C:
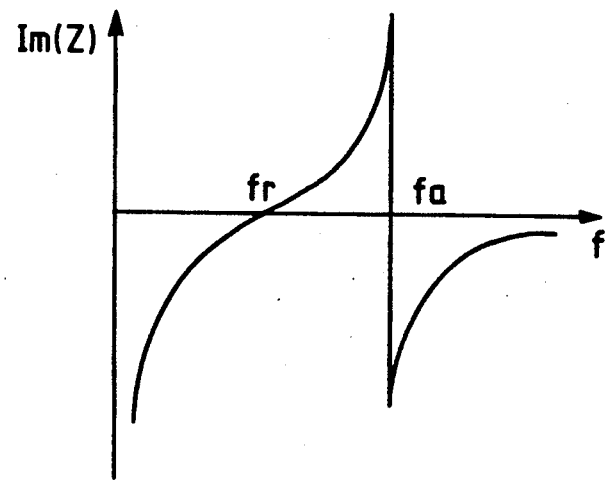

In FIG. 7A is shown a one-port surface acoustic wave resonator which is a multi-pair finger transducer consisting of common electrodes 79 and 70. In the figure, a number 77 denotes a piezoelectric substrate, 78 is an input terminal, and 78, is an output terminal. An electrically equivalent circuit of the resonator is given in FIG. 7B. In this figure, a number 71 denotes an equivalent inductor, 72 is an equivalent capacitor, and 73 is an electrostatic capacitor. FIG. 7C shows an impedance characteristic of the resonator in FIG. 7A where fr is a resonance frequency, and fa is an anti-resonance frequency.

Figure 8:
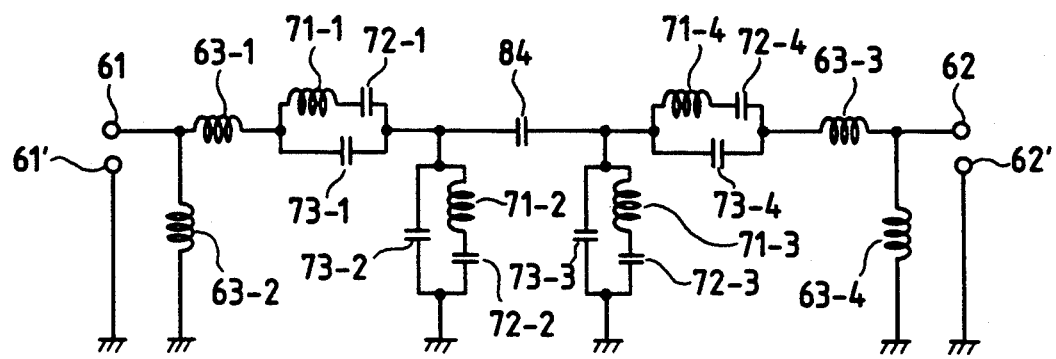
FIG. 8 is an equivalent circuit illustrating an embodiment of the surface acoustic wave device according to the present invention.

The filter in FIG. 6 can be represented by an equivalent circuit in FIG. 8, including a series arm resonator consisting of an equivalent inductor 71-1, an equivalent capacitor 72-1, and an electrostatic capacitor 73-1 and a shunt arm resonator consisting of an equivalent inductor 71-2, an equivalent capacitor 72-2, and an electrostatic capacitor 73-2 which are cascade-connected as looked into the input, and including a series arm resonator consisting of an equivalent inductor 71-4, an equivalent capacitor 72-4, and an electrostatic capacitor 73-4 and a shunt arm resonator consisting of an equivalent inductor 71-3, an equivalent capacitor 72-3, and an electrostatic capacitor 73-3 which are cascade-connected when seen from the input, the input and output cascade-connected resonators being connected through a cap capacitor 84.

Figure 9:
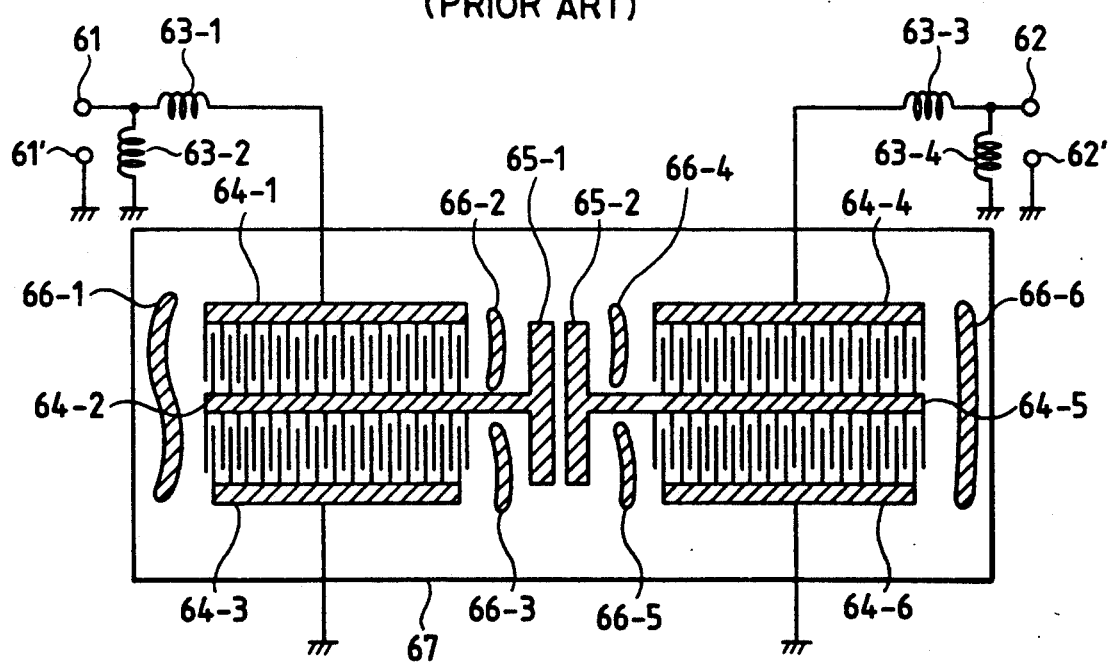
FIG. 9 is a diagram illustrating a conventional surface acoustic wave device.

FIG. 9 shows a schematic diagram of a usual combined resonator filter. The filter has resonators formed on a single piezoelectric substrate 67. It can be represented by the equivalent circuit in FIG. 8 like the one in FIG. 6. The equivalent components of the resonators in FIGS. 6 and 9, however, are different with respect to material constants of the piezoelectric substrates.

Figure 10A:
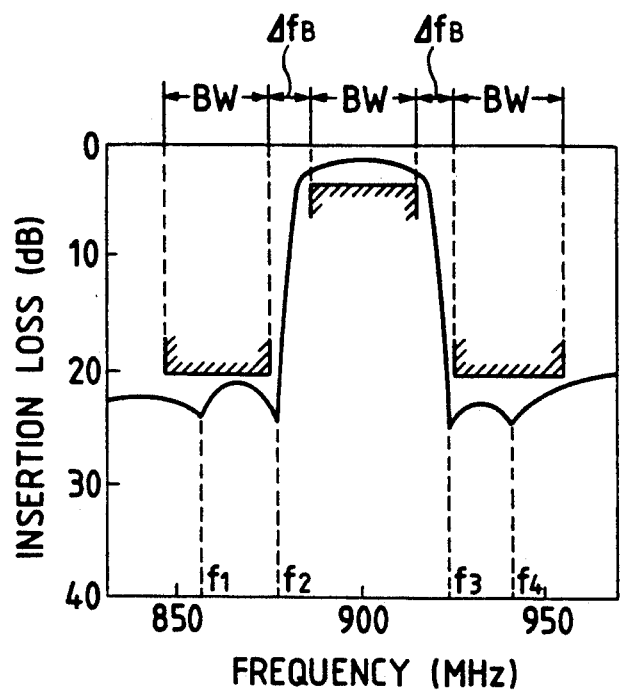
FIGS. 10A and 10B are pass band frequency responses of a surface acoustic wave device according to the present invention and a conventional surface acoustic wave device, respectively.
Figure 10B:
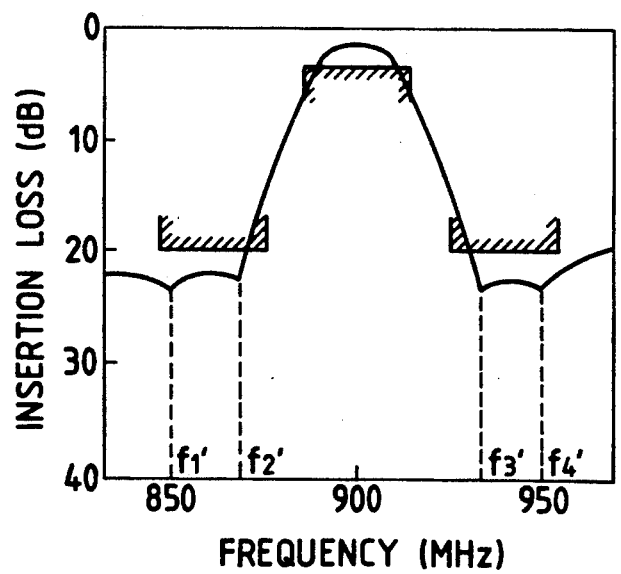

FIGS. 10A and 10B show results of simulated calculations of the frequency responses of the filters in FIGS. 6 and 9, respectively. The frequency allocation used here as an example is the 800 MHz band which is used in parts of the European mobile telephone systems. The band requirement is defined in terms of a band width BW and an interval $\Delta fB$ between a stop band and a pass band. FIG. 10A shows the frequency response of the filter (FIG. 6) of the present invention. FIG. 10B shows the frequency response of the filter of usual type (FIG. 9). It can be seen from the figures that the filter of the present invention has a very sharp cutoff frequency response and little insertion loss as well. The usual filter cannot obtain the sharp cutoff frequency response. Its insertion loss is low only around the center portion of the pass band.

In comparing the frequency responses in FIGS. 10A and 10B, the lower frequency poles (resonant frequencies), $f_1$ and $f_2$, and higher frequency poles (anti-resonant frequencies), $f_3$ and $f_4$, in FIG. 10 correspond to lower frequency poles, $f_1'$, and $f_2'$, and higher frequency poles, $f_3'$, and $f_4'$, in FIG. 10B. The poles, however, are greatly different in that $f_2 > f_2'$ and $f_3 < f_3'$. In general, the sharpness of the cutoff frequency response is determined with respect to the poles ($f_2$ and $f_3$ in FIG. 10A and $f_2'$ and $f_3'$ in FIG. 10B) nearest to the pass band and how these poles affect the characteristics of the pass band. In FIG. 10B, as compared with FIG. 10A, the insertion loss at lower frequencies of the pass band is increased by $f_2'$, irrespective of the fact that $f_2 > f_2'$; also, the insertion loss at higher frequencies is increased by $f_3'$, irrespective of the fact that $f_3 < f_3'$.

This paragraph describes the differences in FIGS. 10A and 10B in view of the differences of the structures and the filters shown in FIGS. 6 and 9. The lower frequency pole $f_2$ closest to the pass band in FIG. 10A is the result of the input shunt arm resonator in FIG. 6 (which corresponds to the equivalent circuit consisting of 71-2, 72-2, and 73-2 in FIG. 8). That is, the resonant frequency of the shunt arm resonator coincides with $f_2$. The higher frequency pole $f_3$ closest to the pass band in FIG. 10A is the result of the input series arm resonator in FIG. 6 (which corresponds to the equivalent circuit consisting of 71-1, 72-1, and 73-1 in FIG. 8). That is, the anti-resonant frequency of the series arm resonator coincides with $f_3$. Similarly, the other lower and higher frequency poles $f_1$ and $f_4$ coincide with the resonance frequency of the output shunt arm resonator and the anti-resonance frequency of the output series arm resonator in FIG. 6, respectively. These relationships identically apply to the filters shown in FIGS. 10B and 9. The poles $f_2'$ and $f_3'$ near to the pass band coincide with the resonant frequency of the input shunt arm resonator and the anti-resonance frequency of the input series arm resonator in FIG. 9, respectively. The other poles $f_1'$ and $f_4'$ coincide with the resonant frequency of the output shunt arm resonator and the anti-resonant frequency of the output series arm resonator, respectively.

Figure 12A:
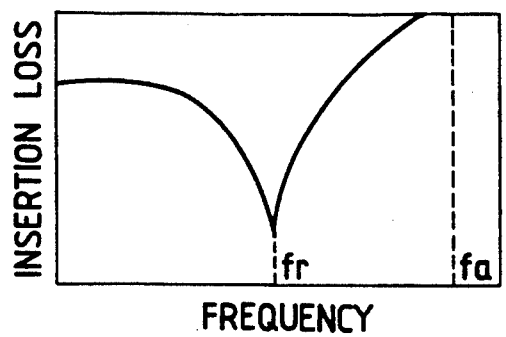
FIGS. 12A, 12B, 13A and 13B are graphs illustrating frequency responses of a one-port resonator in series arm and shunt arm connections; and, FIG. 14 is a block diagram illustrating an embodiment of a communication apparatus according to the present invention.
Figure 12B:
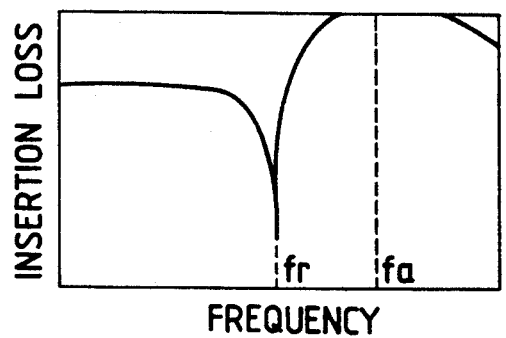
Figure 13A:
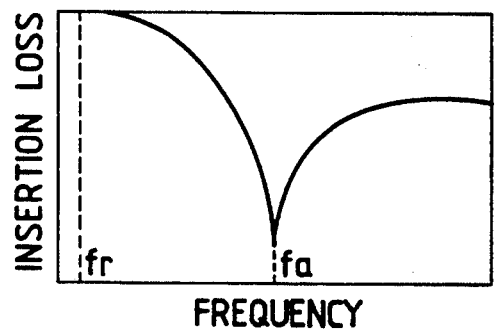
Figure 13B:
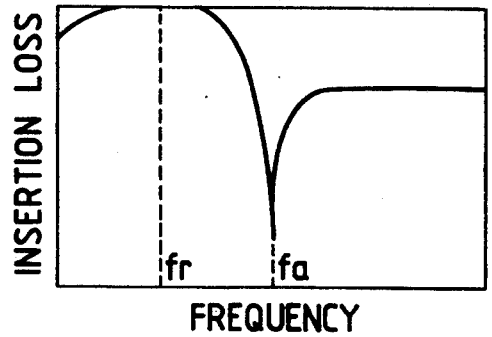

As can be seen from the foregoing description, the difference between the filters shown in FIG. 6 and FIG. 9 relates to the use of multiple piezoelectric substrates. In other words, the desirable features of the present invention as shown in FIG. 6 result from using the multiple piezoelectric substrates. The frequency responses of the shunt arm connect one-port resonators formed on the piezoelectric substrate 67-1 having low electro-mechanical coupling coefficient and on the piezoelectric substrate 67-2 having high electro-mechanical coupling coefficient are shown in FIGS. 12A and 12B. Those that are connected to the series arm are shown in FIGS. 13A and 13B. Frequency distance between the resonant frequency fr and the anti-resonant frequency fa of the resonator is a function of the electro-mechanical coupling coefficient. The frequency distance is short when the coupling coefficient is low. The resonator forming the attenuation poles $f_2$ and $f_3$ near the pass band in FIG. 10A has to be sharp, therefore, it is formed on the piezoelectric substrate having low coupling coefficient to make the band narrow. The resonator formed on the piezoelectric substrate having high coupling coefficient, on the other hand, is advantageous with respect to the insertion loss, since its resonance characteristic is wide. It also has a high conversion efficient from electric signal to acoustic signal or acoustic signal to electric signal with low loss since its coupling coefficient is high. In order to form the attenuation poles $f_1$ and $f_4$ away from the pass band in FIG. 10A which need no particular sharpness, the piezoelectric substrate has a high coupling coefficient. As explained in the foregoing, it is possible to accomplish sharp cutoff frequency response, low loss, and high rejection characteristics when the filter is made of resonators formed on a multiple of piezoelectric substrates.

The numbers of series arm and shunt arm resonator stages depend on requirements such as filter band width and rejection level. With an increase of the number of resonators, the filter design can be optimized by increasing the kinds of substrates.

The construction of the present invention using a multiple of piezoelectric substrates desirable effects if the filter has a proper pass band and stop band, and is narrow between both bands. In particular, it is effective if the relative band width, which is a ratio of the band width to center frequency, is not less than 1%, and if the ratio of the band interval to center frequency is not more than 5%.

The electro-mechanical coupling coefficient $k_2$ of the piezoelectric substrate is determined by the type of piezoelectric material, its cut angle, and propagation direction. Examples of the coupling coefficients of the known piezoelectric materials include around 19% in the 41°-rotated Y-cut X-propagation of LiNbO$_3$, around 11.5% in the 64° X-rotated Y-cut X-propagation of the same, around 7.6% in the 36°-rotated Y-cut X-propagation of LiTaO$_3$, and around 0.16% in the ST-cut quartz X-propagation. If the filter band has to be wide, it tends to increase the number of resonators needed for band synthesis. For this purpose, it is desirable to combine the substrates having high coupling coefficient. For relatively narrow band width, it is possible to use the substrates having low coupling coefficient. It is common in any combination that the substrate having low coupling coefficient is to be used for characteristic synthesis in the vicinity of the pass band. A preferable range of coupling coefficient of the piezoelectric substrate forming a resonator of narrow band in the vicinity of the pass band is 0.1% to 10%. A preferable range of coupling coefficient of the piezoelectric substrate forming a resonator of wide band away from the pass band is not less than 3%. In particular, for wide band characteristic the relative band width of which exceeds 2%, as in the filters for use in mobile telephones, preferable coupling coefficient is not less than 10%.

Further, the present invention can be made more effective by forming on the piezoelectric substrate having lower coupling coefficient the resonator the band of which is made narrower by the electrode structure proposed above by the inventors or by forming the resonator of wide band on the piezoelectric substrate having high coupling coefficient.

The temperature coefficient of a piezoelectric material is specific to it. In general, the temperature coefficient is low when the electro-mechanical coupling coefficient is low. As an example, the temperature coefficient of the LiNbO$_3$ substrate mentioned previously is around 50 to 60 ppm/° C., that of the LiTaO$_3$ is around 30 ppm/° C., and that of the ST-cut quartz substrate is 0 ppm/° C. at room temperature. A range of the interval between the pass band and stop band in which the present invention is more effective, as mentioned previously, is lower than 5% as the ratio to the center frequency. If the working temperature of the filter is room temperature Tr±50° C., the range 5% mentioned above corresponds to a frequency change of the filter with the temperature coefficient of 500 ppm/° C. This means that preferable temperature coefficient of the piezoelectric substrate forming the resonator in the vicinity of the pass band is lower than 55 ppm/° C. For the substrate forming the resonator away from the pass band, it is lower than 80 ppm/° C., though its temperature coefficient may be relatively high.

As an example, the multiple substrates can be fabricated as shown in FIG. 6, with the filter elements being made of chips from specific substrates and being implemented in can package, ceramic package, or resin mold package. FIGS. 11A, 11B, and 11C show other examples in which two or more kinds of materials having different electro-mechanical coupling coefficients are formed on a single substrate. FIG. 11A shows the example that one or more piezoelectric substrates 115 of different coupling coefficients are laminated on a part of a single piezoelectric substrate 114. FIG. 11B shows the example that two or more piezoelectric materials of different coupling coefficients are laminated on the substrate 116, such as silicon, sapphire, or glass. The lamination processes in FIGS. 11A and 11B include a process for bonding the chips and a process that piezoelectric thin films are formed by way of radio frequency spattering. The both processes can provide the same effect for the filter characteristic. FIG. 11C shows the example that a single piezoelectric substrate is ionized or ion diffused on parts thereof to form an area of different coupling coefficient. After this, the surface acoustic wave resonator(s) are formed on the substrate and made us as shown in FIG. 6 to accomplish the present invention.

The air gap provided between the two substrates, as shown in FIG. 6, can reduce direct coupling between input and output which improves the rejection frequency response in the stop band. This effect is the same for the identical and different kinds of substrates.

The filter made of multiple surface acoustic wave resonators according to the present invention provides superior power handling characteristics to transversal filters. It is particularly advantageous in where the output power required for more than 0.1 watt since the filter can withstand an output power of several watts, while contained in a minute chip as small as 3 by 3 mm$^2$.

The surface acoustic wave filter of the present invention can be used in a mobile telephone so that the mobile telephone can be assembled to small size and light weight. It also can be used as radio frequency filter for commercial and sanitation apparatus so that these can be made small and light.

FIG. 14 is a block diagram for a portable telephone set constructed using a duplexer 142 of the present invention shown in FIG. 1A. The voice of a person is converted to electric signal through a microphone, which is inputted to a transmitter part 145. The transmitter part 145 can modulate and amplify the input signal. The output signal is transmitted outside from an antenna 141 through the duplexer 142. A signal received by the antenna 141 is filtered through the duplexer, and is inputted to a receiver part 143, including a mixer circuit shown in FIGS. 2B and 5A. The receiver part can amplify and demodulate the signal to reproduce the voice.

A logic part 147 can be set a channel in a cell according to a signal from a cellular radio base station.

As described in the foregoing embodiments, one filter function can be achieved using a multiple of different filters in the way that parts of the frequency response needed for one filter is formed in the same chip or package as the other filter. This surface acoustic wave device which has been usually available only in the North American system, can be also made in the systems like the European mobile telephone systems where the transmitter and receiver band widths are very wide and the intervals between the transmitter and receiver bands are very narrow.

What is claimed is:

1. A surface acoustic wave filter device comprising:
a first surface acoustic wave sub-filter having a first filter characteristic; and
a second surface acoustic wave sub-filter having a second filter characteristic;
wherein said first and second surface acoustic wave sub-filters are provided on first and second piezoelectric substrates having mutually distinctive electro-mechanical coupling coefficients, respectively, and said first and second filter characteristics are such characteristics that the synthesis of said first and second filter characteristics forms a combined filter having a desired filter characteristic.

2. A surface acoustic wave filter device as set forth in claim 1, wherein the surface acoustic wave filter device also comprises a first package and a second package, the first surface acoustic wave sub-filter being provided in the first package, and the second surface acoustic wave sub-filter being provided in the second package.

3. A surface acoustic wave filter device as set forth in claim 1, wherein said surface acoustic wave filter device further comprises an antenna, wherein a signal received by said antenna is filtered through said first and second surface acoustic wave sub-filters.

4. A communication apparatus comprising:
an antenna for receiving or transmitting a signal;
a first surface acoustic wave sub-filter having a first filter characteristic and electrically connected to the antenna; and
a second surface acoustic wave sub-filter having a second filter characteristic and electrically connected to said first surface acoustic wave sub-filter;
wherein said first and second surface acoustic wave sub-filters are provided on a first and second piezoelectric substrates having mutually distinctive electro-mechanical coupling coefficients, respectively, and said first and second filter characteristics are such characteristics that synthesis of said first and second filter characteristics form a combined filter having a desired filter characteristic.

5. A communication apparatus as set forth in claim 4, wherein the communication apparatus also comprises a first package and a second package, the first surface acoustic wave sub-filter being provided in the first package, and the second surface acoustic wave sub-filter being provided in the second package.

6. A communication apparatus as set forth in claim 4, wherein a signal received by said antenna is filtered through said first and second surface acoustic wave sub-filters.

7. A surface acoustic wave device comprising:
a plurality of surface acoustic wave elements including a plurality of piezoelectric substrates; and
connecting means for electrically connecting said surface acoustic wave elements so that said surface acoustic wave elements are combined with each other to form a combined and desired characteristic,
wherein said piezoelectric substrates have different electro-mechanical coupling coefficients.

8. A surface acoustic wave device as set forth in claim 7, wherein said surface acoustic wave elements are packaged in a single package.

9. A surface acoustic wave device comprising:
a first surface acoustic wave element having a first characteristic desired to transmit a signal;
a second surface acoustic wave element having a second characteristic different from said first characteristic, said first and second surface acoustic wave elements being provided on a first piezoelectric substrate, said second characteristic being such that a third characteristic desired to receive a signal is formed when said second characteristic is combined with a fourth characteristic of a third surface acoustic wave element provided on a second piezoelectric substrate having an electro-mechanical coupling coefficient different from that of said first piezoelectric substrate; and
a package means for packaging both of said first and second surface acoustic wave elements.

10. The surface acoustic wave device of claim 7 wherein:
a first of the plurality of surface acoustic wave elements is comprised of a first receiver filter formed on a first piezoelectric substrate having a first electro-mechanical coupling coefficient;
a second of the plurality of surface acoustic wave elements is comprised of a first transmitter filter formed on the first piezoelectric substrate having the first electro-mechanical coupling coefficient;
a third of the plurality of surface acoustic wave elements is comprised of a second receiver filter formed on a second piezoelectric substrate having a second electro-mechanical coupling coefficient distinct to the first electro-mechanical coupling coefficient; and the connecting means includes means for serially connecting the first and second receiver filters such that an associated radio frequency signal induces signal propagation therethrough.

11. The surface acoustic wave device of claim 7 wherein:

a first of the plurality of surface acoustic wave elements is comprised of a first receiver filter formed on a first piezoelectric substrate having a first electro-mechanical coupling coefficient;

a second of the plurality of surface acoustic wave elements is comprised of a local filter formed on the first piezoelectric substrate having the first electro-mechanical coupling coefficient;

a third of the plurality of surface acoustic wave elements is comprised of a second receiver filter formed on a second piezoelectric substrate having a second electro-mechanical coupling coefficient distinct to the first electro-mechanical coupling coefficient; and the connecting means includes, means for serially connecting the first and second receiver filters such that an associated radio frequency signal induces propagation of a first output signal therethrough;

mixer means for mixing the first output signal with a signal propagated by the local filter to formed a combined output signal.

12. A wave filter comprising:

transceiver means for communicating an external radio frequency signal;

means for receiving a received radio frequency signal from the transceiver means;

a first piezoelectric substrate, having a first electro-mechanical coupling coefficient, including, a first surface acoustic wave generator means having a first electrode and a first common electrode, a second surface acoustic wave generator means having a second electrode and sharing the first common electrode with the first surface acoustic wave generator means;

first coupling means for inducing a signal into the first electrode in accordance with the received radio frequency signal, and means for outputting, from the first common electrode, an intermediate signal induced therein from the received radio frequency;

a second piezoelectric substrate, having a second electro-mechanical coupling coefficient distinct from the first electro-mechanical coupling coefficient, including, a third surface acoustic wave generator means having a third electrode and a second common electrode, a fourth surface acoustic wave generator means having a fourth electrode and sharing the second common electrode with the third surface acoustic wave generator means;

second coupling means for inducing a signal into the third electrode in accordance with the intermediate signal, and means for outputting, from the third electrode, an output signal induced therein from the intermediate signal.

* * * * *